United States Patent
Hung et al.

(10) Patent No.: US 8,208,323 B2
(45) Date of Patent: Jun. 26, 2012

(54) METHOD AND APPARATUS FOR PROTECTION OF NON-VOLATILE MEMORY IN PRESENCE OF OUT-OF-SPECIFICATION OPERATING VOLTAGE

(75) Inventors: Chun Hsiung Hung, Hsinchu (TW); Kuen Long Chang, Taipei (TW); Nai Ping Kuo, Hsinchu (TW); Ken Hui Chen, Taichng (TW); Yu Chen Wang, Kaohsiung (TW)

(73) Assignee: Macronix International Co., Ltd., Hsinchu (TW)

( * ) Notice: Subject to any disclaimer, the term of this patent is extended or adjusted under 35 U.S.C. 154(b) by 0 days.

(21) Appl. No.: 13/108,768

(22) Filed: May 16, 2011

(65) Prior Publication Data

US 2011/0216607 A1    Sep. 8, 2011

Related U.S. Application Data

(63) Continuation of application No. 12/502,126, filed on Jul. 13, 2009, now Pat. No. 7,969,803.

(60) Provisional application No. 61/122,741, filed on Dec. 16, 2008.

(51) Int. Cl.
*G11C 7/00*    (2006.01)

(52) U.S. Cl. ............ 365/195; 365/189.04; 365/189.07; 365/201; 365/191

(58) Field of Classification Search .................. 365/195, 365/189.04, 189.07, 201, 191
See application file for complete search history.

(56) References Cited

U.S. PATENT DOCUMENTS

| 6,617,842 | B2 | 9/2003 | Nishikawa et al. |
| 2005/0219726 | A1* | 10/2005 | Daikokuya et al. ............. 360/31 |
| 2005/0286308 | A1 | 12/2005 | Nagashima |
| 2007/0153581 | A1 | 7/2007 | Kari et al. |

FOREIGN PATENT DOCUMENTS

| CN | 1554069 A | 12/2004 |
| CN | 101023491 A | 8/2007 |
| TW | 408332 | 10/2000 |
| TW | 594765 | 6/2004 |

* cited by examiner

*Primary Examiner* — Thong Q Le
(74) *Attorney, Agent, or Firm* — Stout, Uxa, Buyan & Mullins, LLP

(57) ABSTRACT

A method and apparatus for protecting non-volatile memory is described. A write command is processed only when an operating voltage is between specified operating limits and when a data pattern stored in the non-volatile memory is repeatedly read successfully.

16 Claims, 5 Drawing Sheets

METHOD AND APPARATUS FOR PROTECTION OF NON-VOLATILE MEMORY IN PRESENCE OF OUT-OF-SPECIFICATION OPERATING VOLTAGE

CROSS-REFERENCE TO RELATED APPLICATIONS

This application is a continuation of U.S. application Ser. No. 12/502,126, filed Jul. 13, 2009 and entitled METHOD AND APPARATUS FOR PROTECTION OF NON-VOLATILE MEMORY IN PRESENCE OF OUT-OF-SPECIFICATION OPERATING VOLTAGE, now U.S. Pat. No. 7,969,803 claims the benefit of U.S. Provisional Application No. 61/122,741, filed Dec. 16, 2008 and entitled PREVENTING TO: READ PROTECTED BITS FROM FAILURE OUTSIDE THE SPEC, the entire contents both of which are hereby incorporated by reference.

BACKGROUND OF THE INVENTION

1. Field of the Invention

The present invention relates generally to non-volatile semiconductor memory devices and, more particularly, to methods for reliably operating non-volatile memory devices.

2. Description of Related Art

Non-volatile memory (NVM) devices are in widespread use in a variety of industrial, commercial, and consumer products. Cell phones, personal data assistant (PDA) devices and modems are just a few examples that include embedded NVM modules in their normal configuration.

Integrity of data stored in NVM modules is maintained even when power to the memory is lost. For example, when a cell phone is turned off, names and telephone numbers of a user's phonebook normally remain stored in NVM of the cell phone. Unlike other forms of memory such as masked read-only memory (MROM), which normally is programmed at time of manufacture and which programming cannot thereafter be changed without an expensive change to a mask that defines contents of the MROM, data stored in NVM can be modified by a device in which the NVM is embedded. For example, a user can modify stored values of names, telephone numbers, and other data stored in the NVM of a cell phone. Such storing requires that relatively complicated operations be performed that, white not visible to a human user, are essential to maintaining integrity of stored data.

It typically is a responsibility of a user of an NVM device (e.g., a cell phone manufacturer) to operate the NVM and/or any associated memory controller according to specifications provided by a manufacturer of the NVM. Actions may nonetheless be performed by the user that violate manufacturer's specifications. A memory controller can detect such violations by comparing a value of an applied operating voltage, such as $V_{cc}$, with a high limit, HVCC, and a low limit, LVCC, and can inhibit any attempt to write to the NVM when the value of $V_{cc}$ falls outside the HVCC/LVCC limits. However, process variations and temperature effects may cause the LVCC and HVCC detectors to be inaccurate, resulting in a failure of the memory controller to read/write a correct value from/to non-volatile memory when specified operating voltage limits are violated.

A need thus exists in the prior art for a method of preventing a read/write operation from/to portions of a non-volatile memory when reliably of the operation is in doubt.

SUMMARY OF THE INVENTION

The present invention addresses these needs by providing a method of operating a memory device, the memory device having a data pattern stored therein. An implementation of the method herein disclosed comprises receiving a data pattern as a known value, reading the data pattern from the memory device to generate a test-read result and comparing the test-read result with the known value. The implementation further comprises inhibiting a write command when the test-read result differs from the known value.

An implementation of the method further comprises receiving an operating voltage value, receiving a high voltage limit, receiving a tow voltage limit, and inhibiting a write command when the operating voltage is either greater than the high voltage limit or less than the low voltage limit.

Another implementation of the method can comprise receiving a positive integer, N, repeating the reading (of the data pattern) N times, and inhibiting the write command when the test-read result differs from the known value for at least one of the N times.

A further implementation of the method can comprise processing the write command when the operating voltage is not greater than the high voltage limit, when the operating voltage is not less than the low voltage limit, and when the test-read result is identical to the known value for each of the N times.

An embodiment of the apparatus of the present invention comprises a memory controller configured to control a memory device having a data pattern stored therein. The data pattern has a known value, which corresponds to what should result from a read of the data pattern from the memory device. The memory controller is configured to read the data pattern from the memory device, thus generating a test-read result, to compare the test-read result with the known value, i.e., the actual value of the data pattern in the memory device, and to inhibit the write command when the test-read result differs from the known value.

While the apparatus and method has or will be described for the sake of grammatical fluidity with functional explanations, it is to be expressly understood that the claims, unless expressly formulated under 35 U.S.C. §112, are not to be construed as necessarily limited in any way by the construction of "means" or "steps" limitations, but are to be accorded the full scope of the meaning and equivalents of the definition provided by the claims under the judicial doctrine of equivalents, and in the case where the claims are expressly formulated under 35 U.S.C. §112 are to be accorded full statutory equivalents under 35 U.S.C. §112.

Any feature or combination of features described herein are included within the scope of the present invention provided that the features included in any such combination are not mutually inconsistent as will be apparent from the context, this specification, and the knowledge of one skilled in the art. In addition, any feature or combination of features may be specifically excluded from any embodiment of the present invention. For purposes of summarizing the present invention, certain aspects, advantages and novel features of the present invention are described. Of course, it is to be understood that not necessarily all such aspects, advantages or features will be embodied in any particular implementation of the present invention. Additional advantages and aspects of the present invention are apparent in the following detailed description and claims that follow.

DETAILED DESCRIPTION OF THE PRESENTLY PREFERRED EMBODIMENTS

Figure 1:
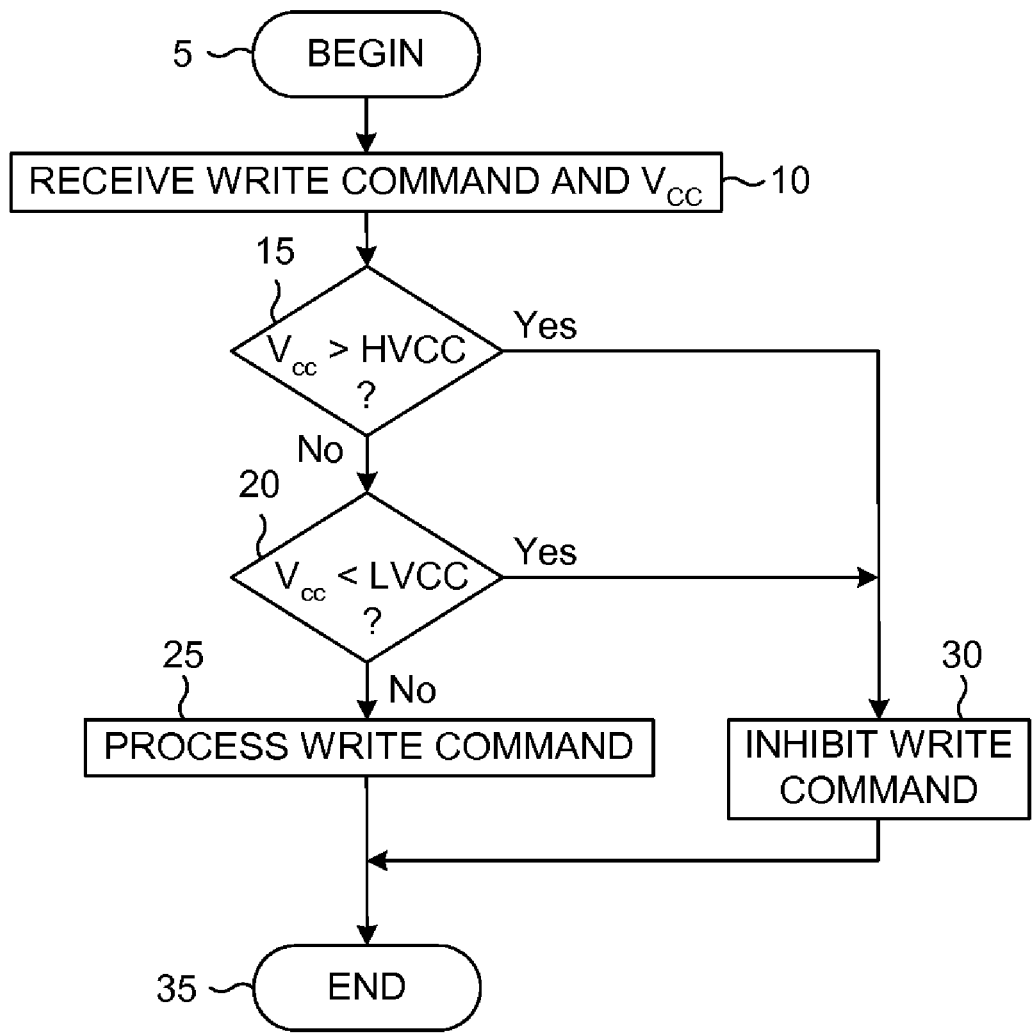
FIG. 1 is a flow diagram illustrating a prior-art method of protecting data in a non-volatile memory device.

Reference will now be made in detail to the presently preferred embodiments of the invention, examples of which are illustrated in the accompanying drawings. Wherever possible, the same or similar reference numbers are used in the drawings and the description to refer to the same or like parts. It should be noted that the drawings are in simplified form and are not presumed, automatically, to be to precise scale in all embodiments. That is, they are intended to be examples of implementations of various aspects of the present invention and, according to certain but not all embodiments, to be to-scale. While, according to certain implementations, the structures depicted in these figures are to be interpreted to be to scale, in other implementations the same structures should not. In certain aspects of the invention, use of the same reference designator numbers in the drawings and the following description is intended to refer to similar or analogous, but not necessarily the same, components and elements. According to other aspects, use of the same reference designator numbers in these drawings and the following description is intended to be interpreted as referring to the same or substantially the same, and/or functionally the same, components and elements. In reference to the disclosure herein, for purposes of convenience and clarity only, directional terms, such as, top, bottom, left, right, up, down, over, above, below, beneath, rear, and front, are used with respect to the accompanying drawings. Such directional terms should not be construed to limit the scope of the invention in any manner.

Although the disclosure herein refers to certain illustrated embodiments, it is to be understood that these embodiments are presented by way of example and not by way of limitation. The intent accompanying this disclosure is to discuss exemplary embodiments with the following detailed description being construed to cover all modifications, alternatives, and equivalents of the embodiments as may fall within the spirit and scope of the invention as defined by the appended claims. It is to be understood and appreciated that the process steps and structures described herein do not cover a complete process flow for the operation of non-volatile memory devices. The present invention may be practiced in conjunction with various operating methods and other techniques that are conventionally used in the art, and only so much of the commonly practiced steps are included herein as are necessary to provide an understanding of the present invention. The present invention has applicability in the field of semiconductor devices and processes in general. For illustrative purposes, however, the following description pertains to a non-volatile memory device and a related method.

Referring more particularly to the drawings, FIG. 1 is a flow diagram illustrating a prior-art method of protecting data in a memory device, which may be a non-volatile memory (NVM) device. The illustrated prior-art method attempts to detect when an operating voltage $V_{cc}$ is out of range and inhibits a write to the NVM when such a condition is detected. The method begins at step 5 and continues at step 10 by receiving a write command and receiving a value of a supply voltage, $V_{cc}$. The value of $V_{cc}$ is compared with a high limit, HVCC at step 15. If $V_{cc}$ is greater than the high limit, then the write command is inhibited at step 30. If $V_{cc}$ is not greater than the high limit, then $V_{cc}$ is compared with a low limit, LVCC. If $V_{cc}$ is less than the low limit, then the write command is inhibited at step 30. If $V_{cc}$ is not greater than the high limit and not less than the low limit, then the write command is enabled at step 25, and the method terminates at step 30. That is, if an operating voltage $V_{cc}$ is determined by the HVCC and LVCC comparisons to be in range, then the prior-art method allows writing to the NVM.

Unfortunately, the prior-art method of FIG. 1 fails adequately to protect an NVM from being corrupted with errored data when accuracy of the HVCC and LVCC detectors is compromised by process variations or temperature effects.

Figure 2:
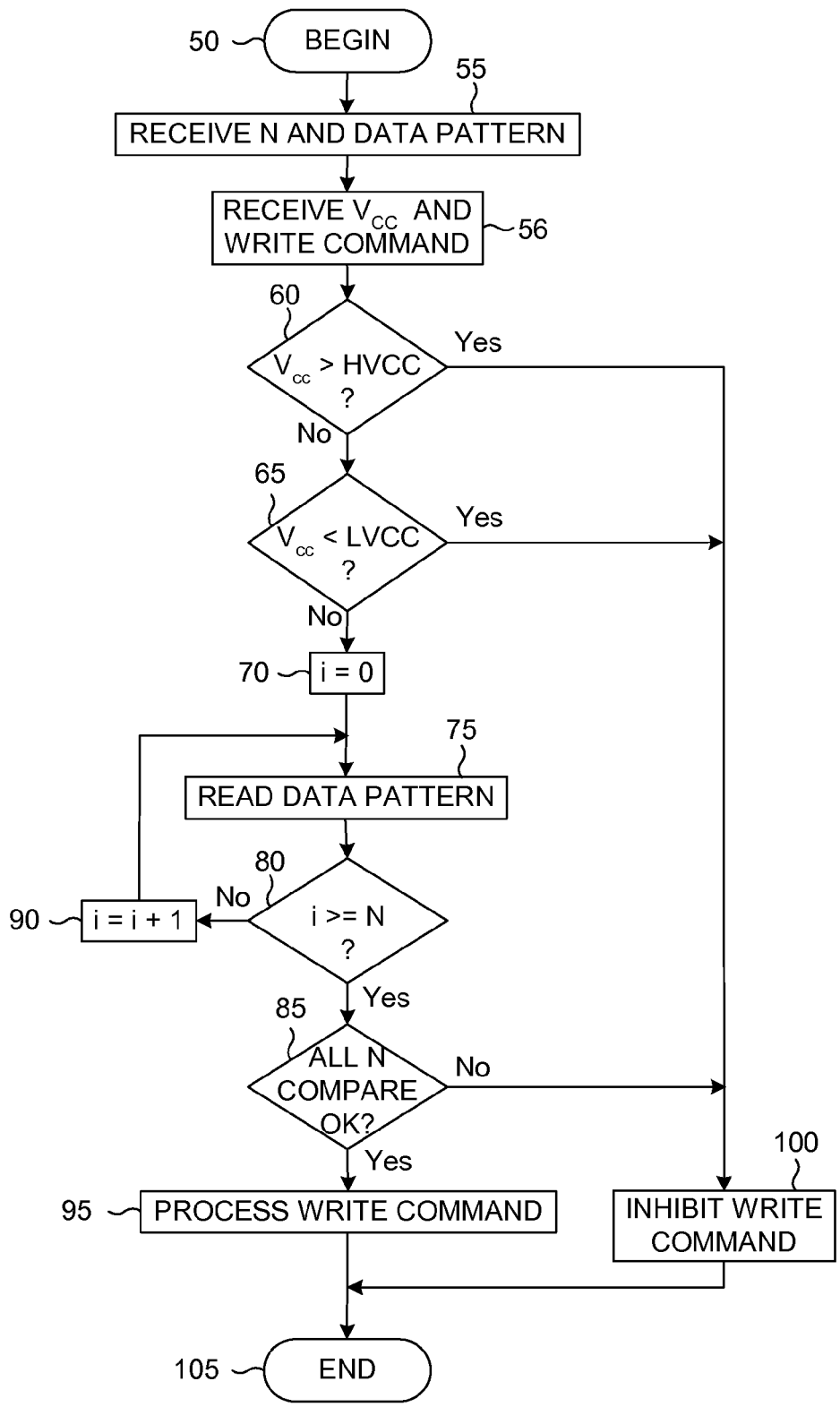
FIG. 2 is a flow diagram describing a method of protecting data in a non-volatile memory device according to the present invention.

FIG. 2 is a flow diagram depicting an implementation of a method of protecting data stored in an NVM according to the present invention. The illustrated implementation may begin (step 50), for example, at a time of manufacture of the NVM with an integer, N, and a data pattern (to serve as a test data pattern and/or a reference or "known value" of the test data pattern) being received at step 55. According to a feature of the present invention, the data pattern may serve as a predetermined quantity that can be read (e.g., from the NVM) during a test operation. The known value may serve as a reference (e.g., stored in a memory controller) to indicate what should result from the test read of that data pattern. In other words, the known value may correspond to what should result from a test read of the data pattern stored in the NVM. Thus, in a simple implementation (cf. step 55) the known value of the data pattern may merely be the data pattern. Structurally, the data pattern can be stored in the NVM (for test reading to generate test-read results) and stored in a memory controller (as the "known value" for reference/comparison against the test-read results). In typical embodiments, the data pattern may comprise, for example, eight bits, and values for N may range, for example, between 1 and 64. A representative embodiment uses a value of 16 for N.

Later in time, a write command and a value for an operating voltage $V_{cc}$ may be received at step 56. At step 60, the value of $V_{cc}$ may be compared with a high voltage limit, HVCC. If $V_{cc}$ is greater than HVCC, then a write command to the NVM may be inhibited at step 100, thereby protecting data stored in the NVM. In that case, the method may terminate at step 105. If, at step 60, $V_{cc}$ is not greater than HVCC, then $V_{cc}$ may be compared with a low voltage limit LVCC at step 65. If $V_{cc}$ is less than LVCC, then the write command may be inhibited at step 100, and the method may terminate at step 105. If, at both step 60 and step 65, the value of $V_{cc}$ is found to be within operating limits, that is, not greater than HVCC and not less than LVCC, then an additional check on NVM integrity may be performed.

For the additional check, commencing at step 70 a counter i is initialized to zero. The data pattern (e.g., stored in the NVM at step 55) can then be read (e.g., from the NVM) at step 75 thereby generating a test-read result, which, for example, can then be loaded into working memory. At step 80 a value of the counter i may be compared with N, and if i is less than N, i may be incremented at step 90, and the method may continue from step 75. If, at step 80, i is greater than or equal to N, then, noting that N test-read results have been loaded into working memory, each of the loaded test-read results may be compared at step 85 with the known value (from step 55). If all N of the comparisons are successful, that is, if the N test-read results are each identical to the known value, then the write command may be processed at step 95, and the implementation may terminate at step 105. If at least one (e.g., one or more) of the comparisons at step 85 is unsuccessful, then the write command may be inhibited at step 100, and the method again may terminate at step 105. Only when all N of the comparisons at step 85 are successful is the write command processed at step 95. In any case, the method may either terminate at step 105, or, according to another implementation (not illustrated), the method may repeat from step 56 with an updated write command value and with an updated value for $V_{cc}$.

Figure 3:
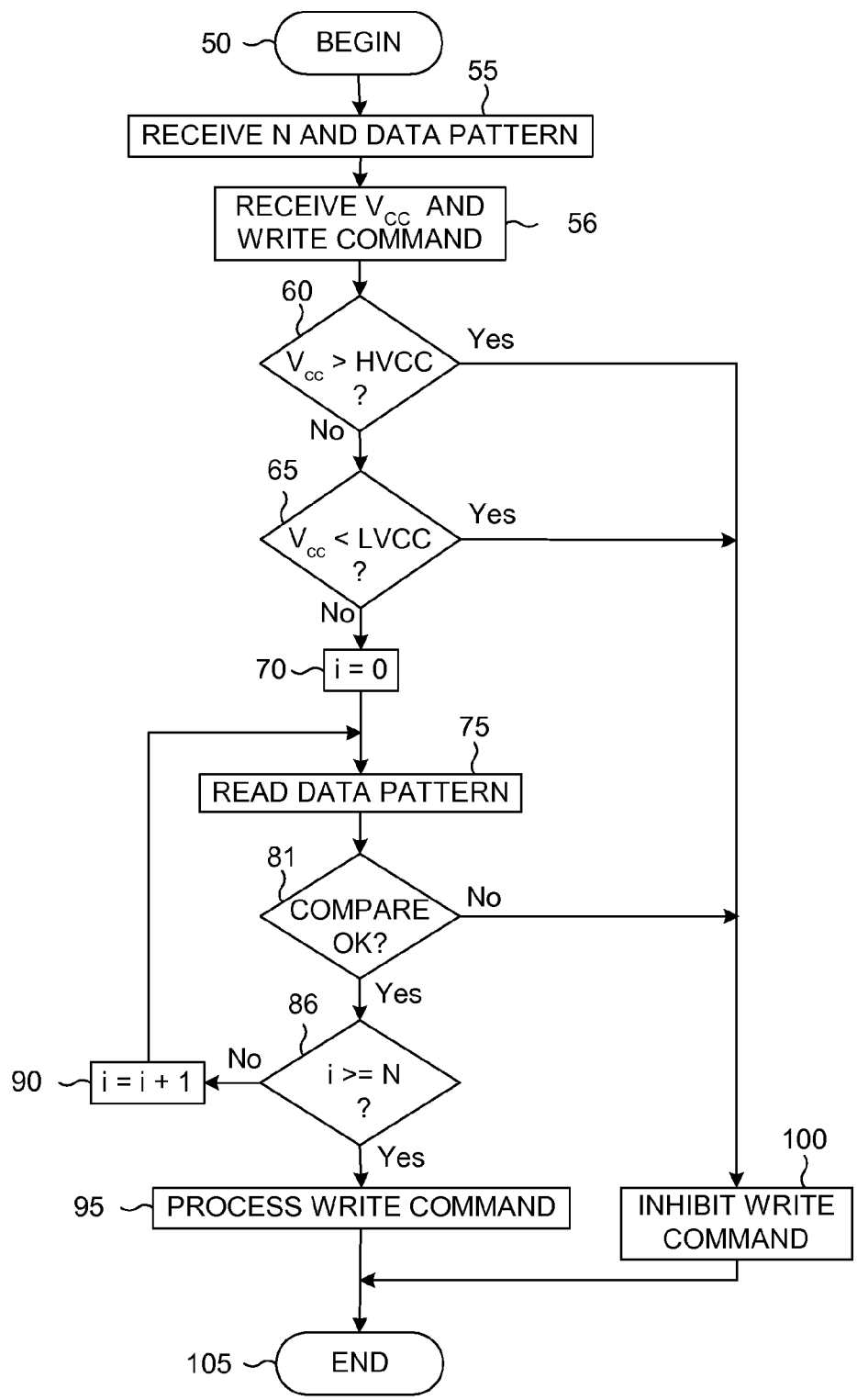
FIG. 3 is a flow diagram describing another method of protecting data in a non-volatile memory device according to the present invention.

A modified implementation of the method of protecting NVM data is illustrated in the flow diagram of FIG. 3. Initial steps of the implementation may be identical to corresponding steps described above with reference to FIG. 2. That is, steps 50, 55, 56, 60, 65, 70 and 75 may be identical in the two implementations. The illustrated implementation may continue at step 81 by comparing the test-read result with the known value, if the comparison is successful, that is, if the test-read result is identical to the known value, then the read/compare procedure (steps 75 and 81) may be repeated. For example, at step 86 a current value of the counter i may be compared with N. If i is not greater than N, then i may be incremented at step 90, and the data pattern again may be read at step 75 to generate a new test-read result. If, at step 81, the new test-read result does not match the known value, then the write command may be inhibited at step 100, and the method may terminate at step 105. Only when the comparison at step 81 is successful for N consecutive times is the write command processed at step 95. As with the implementation of FIG. 2, the method may either terminate at step 105, or the method may repeat from step 56 with an updated value for $V_{cc}$ and with an updated write command.

Figure 4:
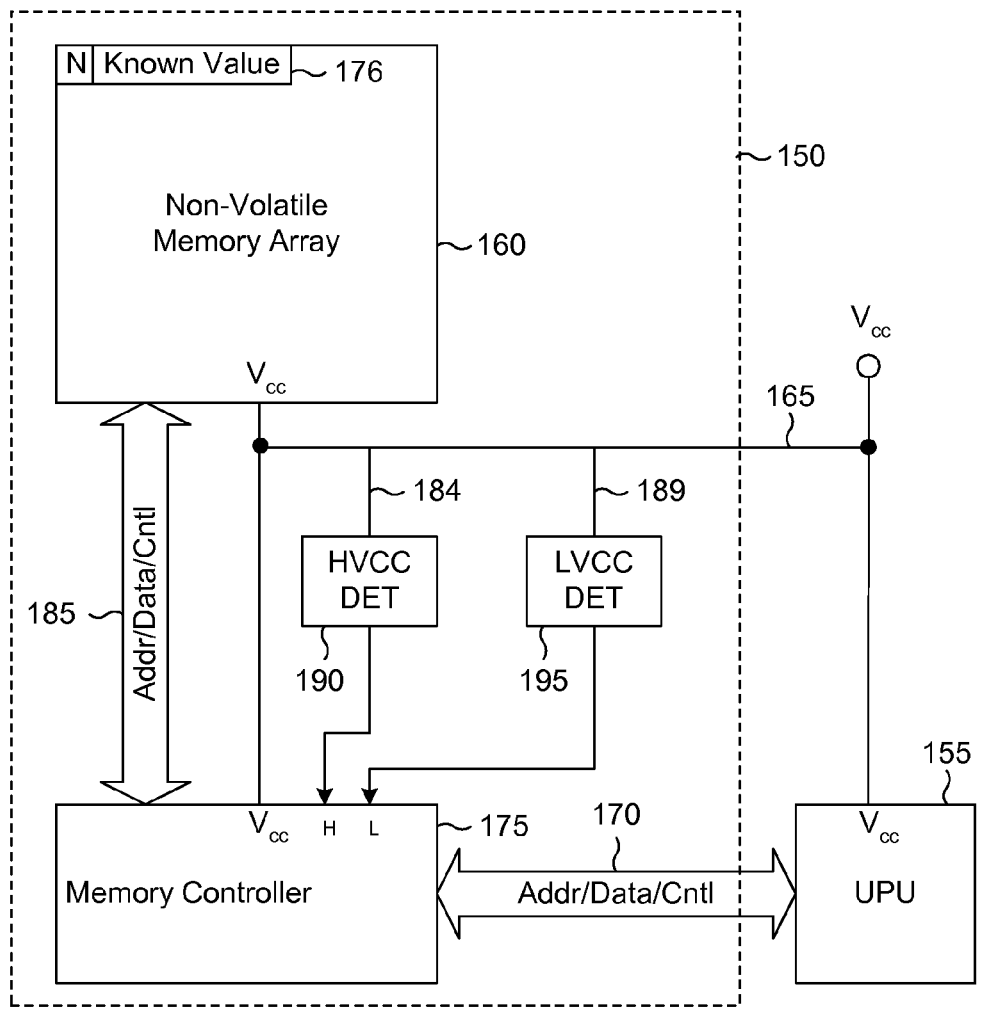
FIG. 4 is a block diagram of an embodiment of a system that employs a non-volatile memory device.

FIG. 4 is a block diagram of an embodiment of an apparatus configured to implement the methods described in FIGS. 2 and 3. The illustrated embodiment comprises an integrated circuit 150 that includes a memory array that may be, for example, a non-volatile memory array (NVM) 160, a memory controller 175, a high-voltage limit detector 190 and a low-voltage limit detector 195. The NVM 160 may have stored therein (e.g., at an address known to the memory controller 175) a data pattern (e.g., having a value likewise known to the controller 175), which may be read by the memory controller 175. The integrated circuit 150 may include a pin 165 to which is connected an operating voltage $V_{cc}$ that, within the integrated circuit 150, connects to the NVM 160 and to the memory controller 175. $V_{cc}$, further, may connect to an input 184 of the high-voltage limit detector 190 and to an input 189 of the low-voltage limit detector 195. The memory controller 175 may communicate with a user processing unit (UPU) 155 over an address/data/control bus 170 through which the UPU 155 is able to pass data to be written to the NVM 160. The address/data/control bus 170, further, may permit the UPU 155 to receive data read from the NVM 160. The memory controller 175 also may communicate with the NVM 160 over an address/data/control bus 185 disposed within the integrated circuit 150. The high-voltage limit detector 190 and low-voltage limit detector 195 may provide signals to the memory controller 175 over connections coupling, respectively, the high-voltage limit detector 190 and low-voltage limit detector 195 to inputs H and L of the memory controller 175. For example, if the operating voltage $V_{cc}$ is greater than an HVCC limit, the HVCC detector 190 may set the H input to the memory controller 175 to '1'. Similarly, if the operating voltage $V_{cc}$ is less than an LVCC limit, the LVCC detector 195 may set the L input to the memory controller 175 to '1'. Otherwise, the H and L inputs may be at '0'.

In typical operation, with reference to FIGS. 3 and 4, a value of N and a data pattern (cf. step 55) may be stored in the NVM 160 as known values at a location 176 during, for example, a process of manufacturing the integrated circuit 150. The UPU 155 may cause data to be stored in the NVM 160 by communicating a write command, which may include a value and an address of the data to be stored, to the memory controller 175 over the address/data/control bus 170. The memory controller 175 may cause the data to be written into the NVM 160 by communicating with the NVM 160 over the address/data/control bus 185. Conversely, the UPU 155 may read data stored in the NVM 160 by communicating a read command, which may include a read address, to the memory controller 175 over the address/data/control bus 170. Similar and/or known protocols, at least in part, may accompany storage and/or retrieval of data with the NVM 160 except where mutually exclusive with the embodiments or features herein disclosed.

When, for example, the memory controller 175 receives a write command from the UPU 155 over the address/data/control bus 170 (cf. step 56), the memory controller 175 may interrogate its H and L inputs from, respectively, the HVCC detector 190 and the LVCC detector 195. If either the H or the L input is at '1', then (cf. steps 60 and 65) the memory controller 175 may communicate with the UPU 155 over the address/data/control bus 170 a signal that informs the UPU 155 that the write command is inhibited (step 100).

If, on the other hand, both the H and the L inputs are at '0', then the memory controller 175 may initialize an internal counter to zero (step 70), my perform a read of the data pattern from the NVM 160 over the address/data/control bus 185 and may receive a test-read result over the same bus 185. The memory controller 175 may compare (step 81) the test-read result with the known value. If the comparison is unsuccessful, that is, if the value of test-read result is different from the known value, then the memory controller 175 may communicate a signal to the UPU 155 over the address/data/control bus 170 that the write command has been inhibited (step 100). If, on the other hand, the comparison at step 81 is successful, that is, if the test-read result is identical to the known value, then a value of the internal counter may be compared to N (step 86). If the internal counter has a value less than N, then the internal counter may be incremented (step 90), and the memory controller 175 may again read the data pattern in the NVM 160 by repeating step 75. The read/compare steps (i.e., steps 75 and 81) may be repeated until, at step 86, the value of the internal counter is no longer less than N, signifying that the data pattern has been read successfully N times, after which the memory controller 175 may process the write command (step 95).

Figure 5:
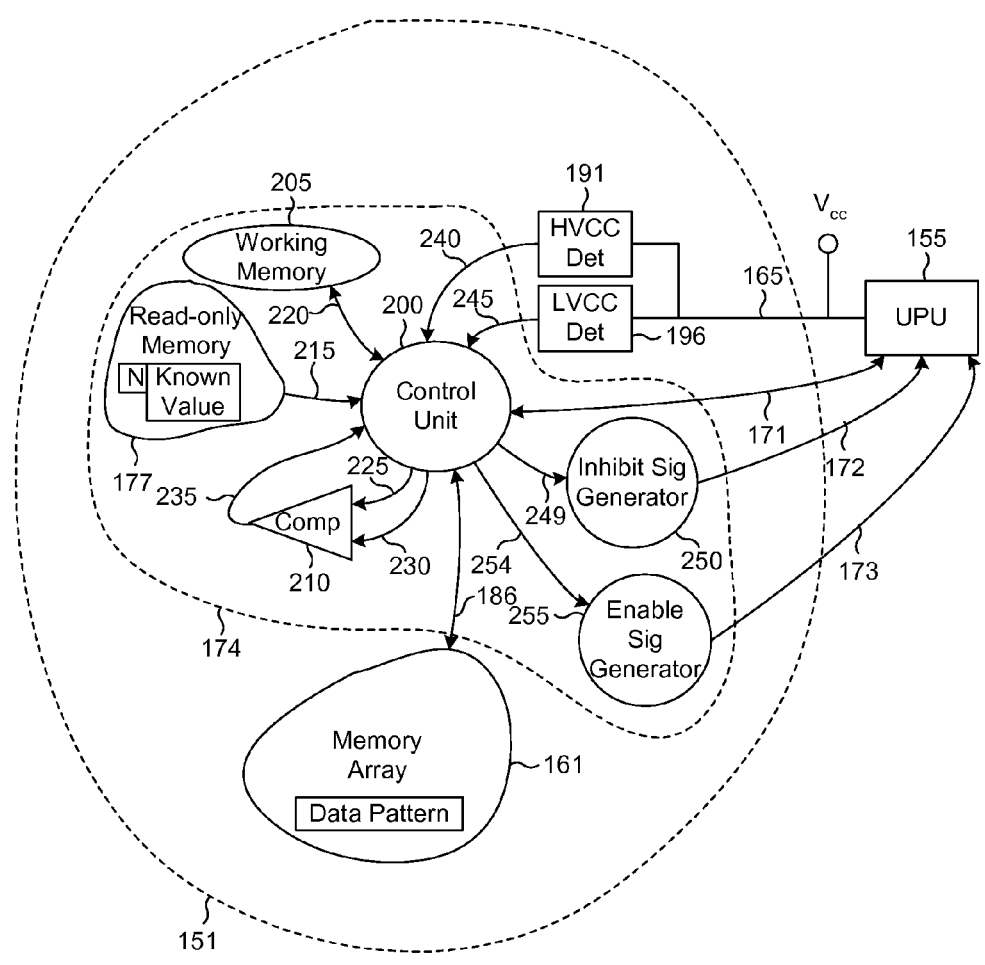
FIG. 5 is a block diagram of an embodiment of a protected memory system according to the present invention.

An embodiment of an apparatus that protects memory according to the present invention is illustrated as a block diagram in FIG. 5. The illustrated embodiment comprises a system 151 that includes a memory array 161, which may be a non-volatile memory as an example, the memory array 161 having a reference data pattern stored therein. The system 151 further includes a memory controller 174. The memory controller 174 may be implemented as, for example, a control unit 200, read-only memory 177, a comparator 210, an inhibit signal generator 250 and an enable signal generator 255, which are now described.

The control unit 200 may communicate with a user processing unit (UPU) 155 over a connection 171 through which the memory controller receives read and write commands from the UPU 155. The control unit 200, further, may connect to the memory array 161 with a connection 186 over which the control unit 200 is able to write data into and to read data from the memory array according to the read and write commands.

The read-only memory 177, which may connect to the controller unit 200 over a connection 215, may have stored therein a known value corresponding to the actual value of the reference data pattern stored in the memory array 161.

In operation, the control unit 200 may receive a write command from the UPU 155 over connection 171 and may read the reference data pattern from the memory array 161 as a test-read result. The control unit 200 may send the test-read result to the comparator 210 over, for example, a connection 225. The control unit 200, further, may read from read-only memory 177 the known value and may send the known value to the comparator 210 over, for example, another connection 230.

The comparator 210, which may connect to the control unit with the pair of connections 225 and 230 and with a third connection 235, may be adapted to receive the test-read result and the known value and to send to the control unit 200 a comparison signal over connection 235. When the test-read result and the known value are identical, then the comparator may send (over connection 235) a comparison signal that indicates a null difference between the known value and the test-read result. When the known value and the test-read result differ, the comparator may send a comparison signal that indicates a non-null difference between the two. When the control unit 200 receives an indication of a non-null difference, the control unit 200 may send a signal over, for example connection 249 to an inhibit signal generator 250 that may then send an indication over a connection 172 to the UPU 155 to inhibit the write command.

According to another embodiment of the memory system of FIG. 5, the memory controller 174 may further comprise working memory 205 with which the control unit 200 is able to communicate over a connection 220. Additionally, an integer, N, may be stored in the read-only memory. Typical values for N may range from 1 to about 64 with N being 16 according to one exemplary embodiment. The control unit 200 in such an embodiment may, upon receiving a write command from the UPU 155, read the integer N from the read-only memory. It may then repeat the reading of the reference data pattern in the memory array 161 N times in order to produce N test-read results. The N test-read results may be stored in the working memory 205. The control unit 200 may send each of the N test-read results and the known value to the comparator 210 as already described and may receive N comparison signals in response. If at least one of the N comparison signals indicates a non-null difference between at least one of the N test-read results and the known value, then the control unit 200 may inhibit the write command.

Yet another embodiment of the memory system of FIG. 5 may comprise a high-voltage limit detector (HVCC) 191 and a low-voltage limit detector (LVCC) 196, which connect to the control unit over respective connections 240 and 245. According to a typical mode of operation, the control unit 200 may receive indications over connections 240 and 245 according to a value of an operating voltage. For example, when the operating voltage is above a high-voltage limit, the HVCC 191 may send a first write-inhibit signal to the control unit 200 over connection 240. Similarly, when the operating voltage is below a low-voltage limit, the LVCC 196 may send a second write-inhibit signal to the control unit 200 over connection 245. When the control unit 200 receives one of the first and second write-inhibit signals, it may send a signal over connection 249 to the inhibit signal generator 250, which may send a signal over connection 172 to inhibit a write command. Otherwise, the control unit 200 may send a signal over connection 245 to the enable signal generator 255, which may send a signal over connection 173 to the UPU 155 to enable the write command.

In view of the foregoing, it will be understood by those skilled in the art that the methods of the present invention can facilitate formation of read-only memory devices, and in particular, non-volatile read only memory devices, in an integrated circuit. The above-described embodiments have been provided by way of example, and the present invention is not limited to these examples. Multiple variations and modification to the disclosed embodiments will occur, to the extent not mutually exclusive, to those skilled in the art upon consideration of the foregoing description. Additionally, other combinations, omissions, substitutions and modifications will be apparent to the skilled artisan in view of the disclosure herein. Accordingly, the present invention is not intended to be limited by the disclosed embodiments, but is to be defined by reference to the appended claims.

What is claimed is:

1. A method of operating a memory device, comprising:
   storing a data pattern into the memory device;
   reading the data pattern from the memory device to form a read result;
   comparing the read result with the data pattern;
   processing a write operation when the read result matches the data pattern;
   receiving an operating voltage value;
   processing the write operation when the operating voltage is not greater than a high voltage limit; and
   processing the write operation when the operating voltage is not less than a low voltage limit.

2. The method as set forth in claim 1, further comprising:
   receiving a positive integer, N;
   repeating the reading N times; and
   processing the write operation when the read result matches the data pattern the N times.

3. The method as set forth in claim 2, wherein a value of N ranges from 1 to about 64.

4. The method as set forth in claim 3, wherein the value of N is about 16.

5. The method as set forth in claim 2, further comprising inhibiting the write operation when the operating voltage is greater than the high voltage limit, when the operating voltage is less than the low voltage limit, or when the read result is not identical to the data pattern for at least one of the N times.

6. The method as set forth in claim 1, further comprising processing the write operation when the read result is identical to the data pattern.

7. A method of operating a memory device, the method storing a data pattern into the memory device;
   receiving a positive integer, N;
   reading the data pattern from the memory device N times to generate a plurality of read results;
   comparing at least a portion of the read results with the data pattern; and
   processing a write operation when the compared read results match the data pattern.

8. The method as set forth in claim 7, wherein a value of N ranges from 1 to about 64.

9. The method as set forth in claim 8, wherein the value of N is about 16.

10. The method as set forth in claim 7, further comprising:
    receiving an operating voltage value;
    receiving a high voltage limit;
    receiving a low voltage limit;
    processing a write operation when the operating voltage is not greater than the high voltage limit; and processing the write operation when the operating voltage is not less than the low voltage limit.

11. The method as set forth in claim 7, further comprising processing the write operation when the read results are identical to the data pattern.

12. A memory system, comprising:
a memory array having a reference data pattern stored therein; and
a memory controller coupled to the memory array, the memory controller comprising:
   a control unit adapted to receive read and write operations, write data into and read data from the memory array according to the read and write operations, and read the reference data, pattern as a read result;
   a comparator coupled to the control unit, the comparator adapted to receive from the control unit the read result and the data, pattern and to send to the control unit a comparison signal according to a difference between the read result and the data pattern, the control unit being further adapted to process a write operation when the comparison signal indicates a match between the read result and the data pattern; and
working memory coupled to the control unit and adapted to store read results, wherein the control unit is adapted to read an integer N from the read-only memory, repeat the reading of the reference data N times to acquire N read results, store the N read results in working memory, send each of the N read results and the data pattern to the comparator, receive N comparison signals from the comparator according to N differences between the N read results and the data pattern, whereby a write operation is processed by the system when the N comparison signals indicate null differences between the N read results and the data pattern.

13. The memory system as set forth in claim 12, wherein the write operation is processed when the comparison signal indicates a null difference between the read result and the data pattern.

14. The memory system as set forth in claim 12, further comprising:
   a high-voltage limit detector adapted to receive an operating voltage and to send a first write-inhibit signal to the control unit when the operating voltage exceeds a high-voltage limit; and
   a low-voltage limit detector adapted to receive the operating voltage and to send a second write-inhibit signal to the control unit when the operating voltage is less than a low-voltage limit, wherein the control unit is further adapted to inhibit the write operation when it receives one of the first and second write-inhibit signals.

15. The memory system as set forth in claim 14, wherein the control unit further comprises an enable signal generator adapted to send a write enable signal to the user processing unit according to an input from the control unit.

16. A method of operating a non-volatile memory array device, comprising:
   storing a data pattern into the non-volatile memory array device;
   reading the data pattern from the non-volatile memory array device to form a read result;
   comparing the read result with the data pattern; and
   processing a write operation when the read result matches the data pattern.

* * * * *